United States Patent [19]
Strobel-Simon et al.

[11] Patent Number: 5,489,422
[45] Date of Patent: Feb. 6, 1996

[54] PROCESS FOR COATING CARBON FIBER REINFORCED CARBON

[75] Inventors: Cornelia Strobel-Simon, Munich; Milan Hrovat, Rodenbach; Heinrich Porth, Hanau, all of Germany

[73] Assignees: MTU Motoren- Und Turbinen-Union Muenchen GmbH; NUKEM GmbH, both of Germany

[21] Appl. No.: 302,736

[22] PCT Filed: Mar. 6, 1993

[86] PCT No.: PCT/EP93/00508

§ 371 Date: Sep. 9, 1994

§ 102(e) Date: Sep. 9, 1994

[87] PCT Pub. No.: WO93/18203

PCT Pub. Date: Sep. 16, 1993

[30] Foreign Application Priority Data

Mar. 9, 1992 [DE] Germany .................. 42 07 380.4

[51] Int. Cl.⁶ ............................................ D01F 9/12
[52] U.S. Cl. ............... 423/447.7; 29/88.06; 29/888.061; 29/889.7; 423/447.1; 423/447.2; 427/255.1; 427/255.2; 427/255.3; 427/255.7; 427/575; 427/579; 428/408; 428/902
[58] Field of Search ............................. 427/255.1, 255.2, 427/255.3, 255.7, 575, 579; 428/408, 902; 28/889.7, 888.06, 888.061; 423/447.7, 447.1, 447.2

[56] References Cited

U.S. PATENT DOCUMENTS 5,254,397  10/1993  Kawai et al. .......................... 428/245

FOREIGN PATENT DOCUMENTS 0129490   6/1984   European Pat. Off. ..
0334791   9/1989   European Pat. Off. ..
58-161981 9/1983   Japan .
63-33575  2/1988   Japan .
84/00924  3/1984   WIPO .

OTHER PUBLICATIONS

Deposition of Silicon Dioxide and Silicon Nitride by Remote Plasma Enhanced Chemical Vapor Deposition; G. Lucovsky, P. D. Richard, D. V. Tsu, S. Y. Lin and R. J. Markunas; Dept. of Physics, North Carolina State University; Journal of Vacuum Science & Technology, May–Jun. 1986; pp. 681–688.

Composition and Structure Control by Source Gas Radio in LPCVD $SiN_x$; Takahiro Makino; Nippon Telegraph and Telehone Public Corporation, Mushahino Electrical Communication Laboratory; Journal of Electrochemical Society, No. 2, Feb. 1983; pp. 450–455.

Primary Examiner—James J. Bell
Attorney, Agent, or Firm—Evenson, McKeown, Edwards & Lenahan

[57] ABSTRACT

In order to have carbon fiber reinforced carbon resistant to oxidation, the proposal is for a process by means of which a bonding layer of amorphous SiNx is applied to the carbon fiber reinforced carbon to which in turn is applied a protective layer which is oxidation resistant at a temperature T, where T>400° C. consisting preferably of $Si_3N_4$.

19 Claims, No Drawings

PROCESS FOR COATING CARBON FIBER REINFORCED CARBON

The invention relates to a process for coating carbon with an amorphous $Si_x$ layer and a protective layer made of crystalline silicon nitride by means of CVD deposition.

From DATABASE WPIL, Section Ch, Week 4483, Derwent Publications Ltd., London, GB; Class C04, AN-83-805055, C 44 & JP A-58161981, of Sep. 26, 1983, a process is known in which ceramic bodies are coated by means of CVD-coating with a first layer made of amorphous $Si_x$ and another layer made of crystalline silicon nitride $Si_3N_4$. Based on this state of the art, carbon fiber reinforced carbon is to be coated by means of the present invention.

Carbon fiber reinforced carbon is distinguished by a high strength while its endurance is very good. However, at this time, a wide use of this material is very limited because of the lacking oxidation stability. Particularly, a use above 400° C. is hardly possible without any protective gas.

However, because of the above-mentioned strength characteristics and the low weight, as use particularly in air and space travel technology would be advantageous.

The present invention is therefore based on the problem of providing a process for coating carbon fiber reinforced carbon by means of at least one layer in such a manner that a high oxidation resistance is possible also at higher temperatures, thus above 400° C., particularly also above 1,500° C.

According to the invention, this problem is achieved in that an $Si_x$-layer is applied as the bonding layer by means of PECVD-deposition to the carbon fiber reinforced carbon (CFC), and the depositing of the protective layer takes place in a reaction space which was cleaned by means of an $H_2/HCl$ gas mixture before the depositing, and the protective layer is deposited essentially while avoiding stable diimides.

Amorphous silicon nitride is deposited as the bonding layer in order to advantageously adapt the different coefficients of expansion of the carbon fiber reinforced carbon and of the protective layer to one another, since their coefficients of expansion have excessive deviations with respect to one another, so that otherwise there is the danger of crack formations or of a chipping-off of the protective layer. For depositing the bonding layer made of amorphous $Si_x$, a micro-multipolar plasma, such as DECR (Distributed Electron Cyclotron Resonance) plasma may be used.

Particularly, in order to insure that the protective layer will be free of cracks and cannot chip off, the application of the protective layer containing silicon nitride should take place while avoiding stable diimides or essentially avoiding stable diimides.

In order to ensure that stable diimides are not present when the silicon nitride layer is deposited, which stable diimides otherwise would also be deposited on the carbon fiber reinforced carbon and could therefore result in the formation of cracks of the protective layer, the used reaction space is cleaned in an $H_2/HCl$-gas mixture before the protective layer is deposited.

In this case, crystalline $Si_3N_4$ may be applied as the protective layer. Amorphous $Si_x$ or $SiO_2$ or a combination of these with crystalline $Si_3N_4$ may also advantageously be applied so that, by means of the process according to the invention, a carbon fiber reinforced carbon is made available which is resistant to oxidation also at high temperatures above 1,500° C., even above 1,700° C., and is therefore suitable to be used particularly in air and space travel technology. Consequently, components such as the outlet cone in the case of turbines, turbine casings, hot-gas guiding components, combustion chambers, guide blades or others, can be manufactured from the carbon fiber reinforced carbon improved according to the invention.

As a further development of the invention, it is provided that, the carbon fiber reinforced carbon is cleaned before the bonding layer is applied. This may take place by a bombardment by means of noble gas ions, such as argon ions of a plasma, preferably at a temperature above 200° C. and preferably at a pressure lower than $1 \times 10^{-2}$ hPa.

The cleaning facilitates the application of the bonding layer. A microwave-incited plasma is preferably used for the cleaning. Also, the carbon fiber reinforced carbon should be connected to an electric potential (BIAS) of at least 20 V, preferably from 60 V to 150 V.

For depositing the crystalline $Si_3N_4$ layer, dichlorosilane and ammonia are used as process gases at a ratio of from 1:2 to 1:8, preferably 1:5, while hydrogen is used as the carrier gas.

According to another measure, it is provided that the crystalline silicon nitride layer is deposited at a pressure of less than 5hPa and preferably at a temperature of between 1 000° C. and 1,100° C.

Finally, the invention relates to a carbon fiber reinforced carbon, in particular, intended as a material to be used in air and space travel technology, in which case the carbon fiber reinforced carbon is characterized in that it is coated with an outer protective layer made of crystalline silicon nitride which has a high oxidation resistance, a bonding layer being arranged between the protective layer and the carbon fiber reinforced carbon and having a coefficient of expansion between that of the protective layer and that of the carbon fiber reinforced carbon.

In the following, the invention will be explained by means of an example which discloses additional details, advantages and characteristics.

An outlet cone of a turbine made of carbon fiber reinforced carbon (CFC) was charged into a system for a plasma-supported chemical vapor deposition (PECVD-system) in which the workpiece was subjected to a microwave multipolar distributed plasma at a pressure of $5 \times 10^{-3}$ hPa at a temperature of 500° C. in order to be bombarded with argon ions for a period of 10 minutes. In this case, the workpiece was connected to a BIAS potential of 60 V. By means of this process step, the workpiece was cleaned.

Then the workpiece, which was heated directly, was heated to a temperature of approximately 750° C. and was subjected to $SiH_2Cl$ and $NH_3$ process gases, specifically in amounts of 13 MLST (standard milliliters per minute) and 39 MLST. The workpiece was subjected to the process gases for 60 minutes, in which case the output of the used microwave generator was 1,000 W. Under these conditions, a bonding layer was deposited which had a diameter growth of 1 $\mu mh^{-1}$.

Then the workpiece provided with the bonding layer was charged in a CVD-system in order to apply a crystalline protective $Si_3N_4$ layer. In this case, $SiH_2Cl_2$ and $NH_3$ were also used as process gases. Since, during the reaction of dichlorosilane and ammonia, diimide $—Si(NH)_2$ — is formed first, which in two additional phases results in silicon nitride by the delivery of ammonia, care should be taken that a complete reaction takes place preferably in $Si_3N_4$ and no diimides are deposited.

In order to ensure that no stable diimides are situated in the reaction space, a cleaning must first be carried out by means of an $H_2/HCl$ gas mixture at a temperature of approximately 1,800° C.

After the cleaning, the workpiece having the bonding layer is charged into the reaction space, in order to then charge in the CVD-process, at a temperature of 1,050° C. and a process pressure of 2.5hPa, the process gases dichlorosilane and ammonia at a ratio of 1:5. $H_2$ is used as the carrier gas. In the case of these parameters, a depositing rate of 1 μm min$^{-1}$ can be achieved. In the reaction space, the workpiece is then subjected to the process gases for 60 minutes for the purpose of depositing the protective silicon nitride layer.

We claim:

1. A process for coating carbon with an amorphous $SiN_x$-layer and a protective crystalline silicon nitride layer by a CVD-deposition, comprising the steps of using carbon-fiber reinforced carbon as the carbon, applying the amorphous $SiN_x$ layer as bonding agent by PECVD-deposition, providing a reaction space which is cleaned by $H_2$/HCl to avoid stable diimides, and charging the bonding layer into the reaction space which is subjected to process gases for the purpose of depositing the protective layer.

2. The process according to claim 1, wherein the protective layer is crystalline $Si_3N_4$.

3. The process according to claim 1, wherein the carbon-fiber reinforced carbon is cleaned before the application of the bonding layer.

4. The process according to claim 3, wherein the protective layer is crystalline $Si_3N_4$.

5. The process according to claim 3, wherein the step of cleaning the carbon reinforced carbon uses a plasma consisting of noble gas ions at a temperature above 200° C. and at a pressure of less than $1 \times 10^2$ hPa.

6. The process according to claim 5, wherein the plasma is at a temperature above 200° C.

7. The process according to claim 6, wherein the plasma is at a pressure of lower than $1 \times 10^2$ hPa.

8. The process according to claim 7, wherein the noble gas ions are argon ions.

9. The process according to claim 5, wherein the plasma is a microwave-incited plasma.

10. The process according to claim 1, wherein the carbon-fiber reinforced carbon is connected to an electric potential (BIAS) of at least 20 V.

11. The process according to claim 10, wherein the electric potential is between about 60 to 150 V.

12. The process according to claim 1, wherein the step of deposition of the bonding layer occurs via a microwave multipolar plasma.

13. The process according to claim 12, wherein the plasma is DECR plasma.

14. The process according to claim 1, wherein the step of depositing of the CVD-deposited protective layer occurs in a vacuum.

15. The process according to claim 1, wherein the step of depositing the crystalline nitride-layer uses dichlorosilane and ammonia as process gases at a ratio of 1:2 to 1:8 and hydrogen as the carrier gas.

16. The process according to claim 15, wherein the ratio is 1:5.

17. The process according to claim 1, wherein the step of depositing the crystalline nitride-layer uses a pressure of less than 5 hPa and a temperature of from about 1,000° C. to 1,100° C.

18. The process according to claim 17, wherein the step of depositing the crystalline nitride-layer uses dichlorosilane and ammonia as process gases at a ratio of 1:2 to 1:8 and hydrogen as the carrier gas.

19. A carbon-fiber reinforced carbon usable as material for air and space travel applications, comprising a bonding layer which has been applied to a carbon-fiber reinforced carbon substrate and an outside crystalline $Si_3N_4$-layer which, while stable diimides have been excluded as a result of a reaction space having been cleaned by $H_2$/Hcl mixture, has been applied to the bonding layer.

* * * * *